(12) United States Patent
Ruvalds

(10) Patent No.: US 6,526,002 B1
(45) Date of Patent: Feb. 25, 2003

(54) MAGNETO-OPTIC DEVICE EXHIBITING CHANGES IN REFLECTIVITY RELATIVE TO A MAGNETIC FIELD AND METHOD AND SYSTEMS INCORPORATING THE SAME

(76) Inventor: John Ruvalds, 317 Harvest Dr., Charlottesville, VA (US) 22903

( * ) Notice: Subject to any disclaimer, the term of this patent is extended or adjusted under 35 U.S.C. 154(b) by 185 days.

(21) Appl. No.: 09/650,189

(22) Filed: Aug. 29, 2000

Related U.S. Application Data

(60) Provisional application No. 60/152,156, filed on Sep. 2, 1999.

(51) Int. Cl.[7] .............................................. G11B 11/00
(52) U.S. Cl. .................................... 369/13.38; 428/64.3
(58) Field of Search .......................... 369/13.01, 13.02, 369/13.38, 13.42, 13.44, 275.1; 428/64.3, 694 ML, 694 MM; 365/122

(56) References Cited

U.S. PATENT DOCUMENTS

| | | | |
|---|---|---|---|
| 4,103,315 A | 7/1978 | Hempstead et al. | 360/110 |
| 4,645,722 A * | 2/1987 | Katayama et al. | 428/694 ML |
| 4,664,977 A * | 5/1987 | Osato et al. | 428/336 |
| 5,418,076 A * | 5/1995 | Shiratori | 428/694 EC |
| 5,422,572 A | 6/1995 | Yao | 324/309 |
| 5,546,253 A | 8/1996 | Che | 360/113 |
| 5,831,944 A * | 11/1998 | Nishimura | 369/13 |
| 5,903,526 A | 5/1999 | Tabata | |
| 6,197,440 B1 * | 3/2001 | Shiratori | 369/13 |

* cited by examiner

Primary Examiner—Tan Dinh
(74) Attorney, Agent, or Firm—Steptoe & Johnson

(57) ABSTRACT

A magneto-optic device is provided. The device includes a base magnetic layer and a top magnetic layer having a spin orientation which may be rotated by a magnetic field. An inner layer displays a large change in optical reflectivity when a magnetic field is applied. The inner layer is positioned between the base magnetic layer and the top magnetic layer. The device may be used as a sensor, optical modulator, or switch. Several adjacent devices can collectively form a display screen.

11 Claims, 2 Drawing Sheets

MAGNETO-OPTIC DEVICE EXHIBITING CHANGES IN REFLECTIVITY RELATIVE TO A MAGNETIC FIELD AND METHOD AND SYSTEMS INCORPORATING THE SAME

CROSS REFERENCE TO RELATED APPLICATIONS

The present application claims priority under 35 U.S.C. §119(e) to U.S. Provisional Application 60/152,156, filed on Sep. 2, 1999, the disclosure of which is incorporated by reference herein in its entirety.

BACKGROUND OF THE INVENTION

Research groups at IBM and other labs have developed methods to form multi-layer films composed of a base ferromagnet (like iron or permalloy), whose spin orientation is fixed in a given direction, a second layer of an ordinary metal (such as copper), and a top magnetic layer whose spin orientation can be rotated by an external magnetic field. These structures exhibit a giant magneto-resistance (GMR), which is used in magnetic storage of computer memory. The method measures changes in electrical current and voltage to detect the external magnetic field.

Prior studies of magneto-optical recording techniques employ the Kerr or Faraday effects to rotate the light polarization by the magnetic forces in a material. The standard Kerr technology may employ a single magnetic film (e.g., cobalt) deposited on a metal like copper, and such technologies are disclosed in "Magnetic Recording Technology", C. Denis Mee and Eric D. Daniel, editors, chapter 10 (McGraw-Hill, NY 1995).

The tri-layer arrangement of a simple metal sandwiched between two magnetic layers is called a "spin-valve" system, because an external magnetic field controls the flow of electrical current by regulating the scattering gate for electrons with a fixed spin direction. The corresponding giant magneto-resistance (GMR) in Fe/Cr/Fe multi-layers was discovered by M. N. Baibitch et al, Phys. Rev. Lett. 61,2472(1988). The application of GMR devices for computer storage has stimulated enormous interest, with more than 1,000 papers published on electrical resistance, magnetic, and structural properties of such films. However, the magneto-optic modulation and its relationship to reflectivity has not been adequately explored.

BRIEF SUMMARY OF THE INVENTION

Certain metals exhibit a dramatic change in their optical reflectivity, which is caused by electron collisions between nearly parallel paths. Such electronic trajectories are said to be "nested" and tend to favor anti-ferromagnetic spin alignment in metals like chromium. Thus, the unconventional optical conductivity features, which have been observed in chromium, rare earth metals, and in high temperature superconductors, may be used in accordance with the present invention to detect a magnetic field.

The magneto-optic device may also be used as an optical switch or light modulator for fiber-optics telecommunications. A change in the transmission and reflectance of infrared light through the multi-layer film can be controlled by a small external magnetic field. Thus the film can encode a signal on the carrier light beam, or reflect the light beam in a desired direction for purposes of switching signal paths. The spin-flip in the magnetic layer occurs in less than one nanosecond, so that the optical switch application would yield very high bandwidth capabilities.

Silicon substrates for the metal films are preferable for fiber-optic applications. The thickness of the inner layer metal film is chosen to yield an anti-ferromagnetic coupling between the top and bottom magnetic films. The external field will overcome this weak tendency toward anti-parallel spin alignment and rotate the spins to point in the same direction. The resulting exchange forces modify the electronic structure in the middle layer and thus alter its ability to reflect or transmit light.

The theoretical background for the magneto-optic sensor invention stems from calculations of the optical reflectivity of high temperature superconductors. A review of this theory basis—in the absence of magnetic field effects—is disclosed in J. Ruvalds, Superconductor Science and Technology 9,905 (1996).

Optical switching in telecommunications currently converts light signals to electrical current in circuits, processes the information by relatively slow electronic methods, and then converts the message to another infrared light beam. Since this electronic delay limits bandwidth for internet communications, there is interest in switching a light beam by purely optical methods. Examples of new optical switches include "bubbles", "micro-mirrors", and liquid crystals whose merits and promise are described in: MIT Technology Review, July/August 2000.

The present invention provides a layered arrangement of metal films, where the inner layer exhibits a large change in the optical reflectivity as a function of frequency of the incoming light. A standard Drude reflectance of ordinary metals (like lead, copper, or silver) remains close to 95% over a wide range of incoming light energies that extend to 1 eV or more, as shown in FIG. 1. However, a dramatic drop of the reflectivity (to about 20% near 1 eV) has been calculated for electron collisions on nearly parallel trajectories, and the application of a magnetic field should restore the latter anomalous small reflectance toward the normal high value of a typical metal. Thus, a desirable metallic inner layer in the magneto-optic sensor should have a spectrum that resembles the computed solid curve in FIG. 1. Materials that exhibit the anomalous reflectivity drop include chromium, rare earth metals, and high temperature superconductors.

An external magnetic field will split the electron energy levels in the inner layer metal and thus remove the origin of the anomalous reflectivity. Hence, a change in the optical reflectance in the visible light range will be a particularly good indicator of a magnetic field. At microwave and infrared frequencies, smaller changes in the inner layer reflectivity may also be used to detect a magnetic field.

The base layer of a ferromagnetic metal (like iron or permalloy) amplifies the effect of an external field, which rotates the spin orientation of the top magnetic layer. FIG. 2 illustrates parallel spin alignment in a multi-layer structure that tends to maximize the spin splitting of the energy bands in the inner layer. This type of multi-layer structure produces a giant magneto-resistance (GMR) for an ordinary inner layer metal like copper, and such DC resistance devices are used for computer memory storage. However, the design of a multi-layer device for the purpose of detecting a magnetic field by measuring the infrared or optical reflectivity is new.

Transmission of light through a multi-layer film can be modulated by a small external magnetic field via very strong exchange forces between a magnetic layer and an adjacent layer of a metal like chromium. When the external field aligns the magnetic spins of top and bottom layers, the electron motion in the inner layer is modified by the exchange coupling to the adjacent magnetic layers. In the case of chromium, the applied magnetic field may change the infrared light transmission from 40% to 5% or less. Hence the multi-layer can be used to switch or modulate a light beam in a silicon fiber that is used for data or voice transmission.

Other exemplary embodiments and advantages of the present invention may be ascertained by reviewing the present disclosure and the accompanying drawings.

BRIEF SUMMARY OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
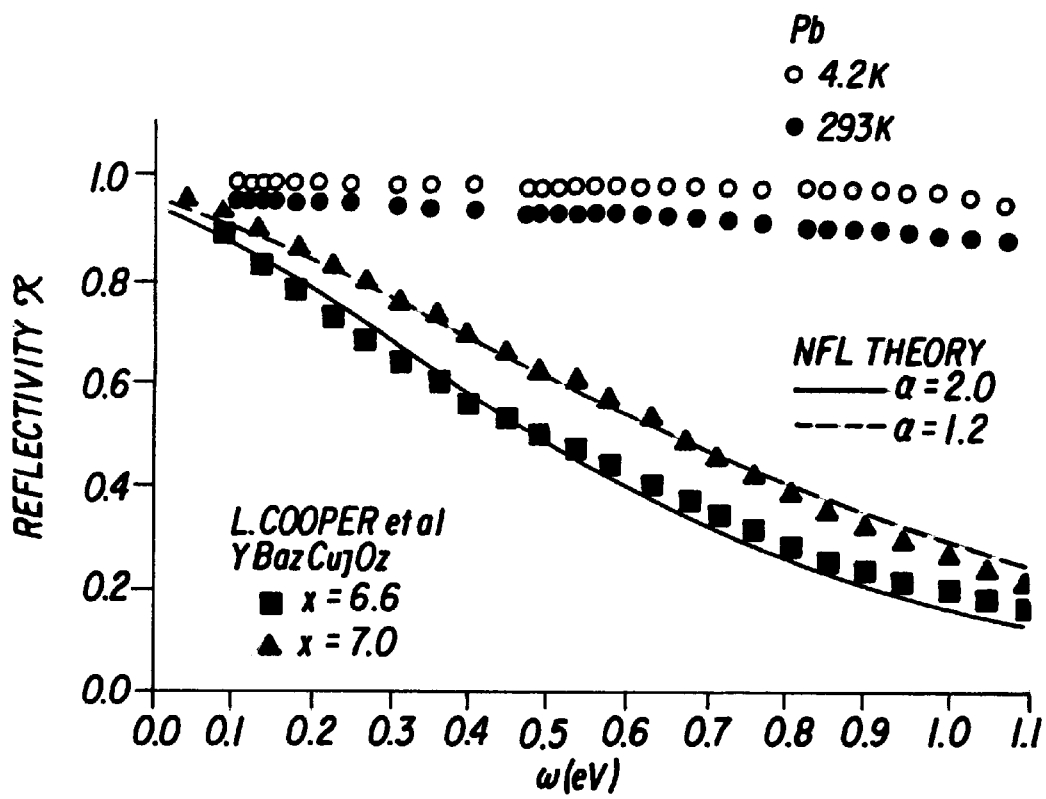
FIG. 1 is a graph of optical reflectivity curves of an embodiment of the present invention.

FIG. 1 shows the optical reflectivity of a standard metal which follows the Drude shape that is indicated by data points for lead. Analysis of selected metals yields the anomalous drop in the reflectivity as a function of frequency that is shown by the solid curve. The latter unconventional behavior has been observed in chromium and other metals.

A multi-layer structure for the magneto-optic sensor of the embodiment includes a base magnetic layer B (such as iron, for example) with fixed spin orientation, and a top layer T whose spin orientation can be rotated by an external magnetic field. An inner layer I is chosen to display a large change in optical reflectivity when a magnetic field is applied. In the case of substrates like silicon, an inner metal layer with a certain thickness produces an anti-ferromagnetic alignment that points the spins in the top layer in the opposite direction to the spins in the bottom layer. Then the external field aligns spins in both top and bottom layers in the same direction.

A brief list of metals that exhibit the unconventional reflectivity may include, by way of non-limiting example, chromium, tantalum, and various alloys of these metals with vanadium and many other elements. Among the rare earth metals, Gadolinium, Yttrium, Ytterbium, Ruthenium and others are good candidates. All of the high Tc superconductors show the reflectivity anomaly, including YBCO, LSCO, BSCO and others. Also, the strontium ruthenate alloys show a similar reflectively. Nesting is known to be important in all of the above materials, although the nesting concept of copper oxide alloys is controversial in the high temperature superconductor field. At certain temperatures, all of the above materials are paramagnetic, and only some develop antiferromagnetic order at low temperature. Although bulk copper will show only standard Drude reflectivity, the film configuration can change the electronic structure of such a simple metal and perhaps induce nesting under the influence of adjacent layers of other materials. Thus copper may be effective for the inner layer of a magneto-optic device.

The inner layer may thus be a single metal or alloy, or a combination of metal and/or alloy layers that collectively exhibit the characteristics noted herein.

The preferred embodiment includes a layered arrangement of metal films, where an inner layer exhibits a large change in the optical reflectivity as a function of frequency. A standard Drude reflectance of ordinary metals (like lead, copper, or silver) remains close to 95% over a wide range of energy that extends to 1 eV or more, as shown in FIG. 1. However, a dramatic drop of the reflectivity (to about 20% near 1 eV) has been calculated for electron collisions on nearly parallel trajectories, and the unconventional decline is observed in chromium, rare earth metals, and high temperature superconductors.

The application of a magnetic field should restore the latter anomalous small reflectance toward the normal high value of a typical metal. The magnetic field should be applied to change the relative orientation of the magnetism in the layers, which is typically parallel to the layer. However, there are some cases where the magnetism of one layer is perpendicular to the film. Regarding the applied field, it may originate from a tiny spot on a computer drive, so its field lines may be more complex than a simple "parallel" or "perpendicular" description. As an estimate, an external field of 1–10 Gauss should be sufficient to change the reflectivity in a significant manner. The reason is that such a small field has been demonstrated to switch the arrangement of magnetic layers, which in turn produces a change in the exchange field of a 100,000 Gauss or more within the central non-magnetic metal layer.

A large field splits the electron energy levels into spin-up and spin-down states whose trajectories will differ from the field-free case. Thus, the field will modulate the reflectivity of a metallic inner layer, which forms a magneto-optic sensor. The inner metallic layer should have a spectrum that resembles the computed solid curve (NFL theory) in FIG. 1. The combination of field effects will change the resistance of the inner metallic layer. However the resistance change will not detract from the optical phenomena.

An external magnetic field will thus remove the origin of the anomalous reflectivity. Hence a change in the optical reflectance in the visible light range will be a particularly good indicator of a magnetic field. At microwave and infrared frequencies, smaller changes in the inner layer reflectivity may also be used to detect a magnetic field.

The base layer of a ferromagnetic metal (like iron or permalloy) amplifies the effect of an external magnetic field. The field rotates the spin orientation of the top magnetic layer, so that the combined effect of the top and bottom magnetic layers is a large exchange field when their spins are parallel. When the spins in the top layer point in the opposite direction of the magnetization in the bottom layer, the net exchange field in the inner layer tends to diminish if the magnetic layers are comparable in thickness and composition.

Figure 2:
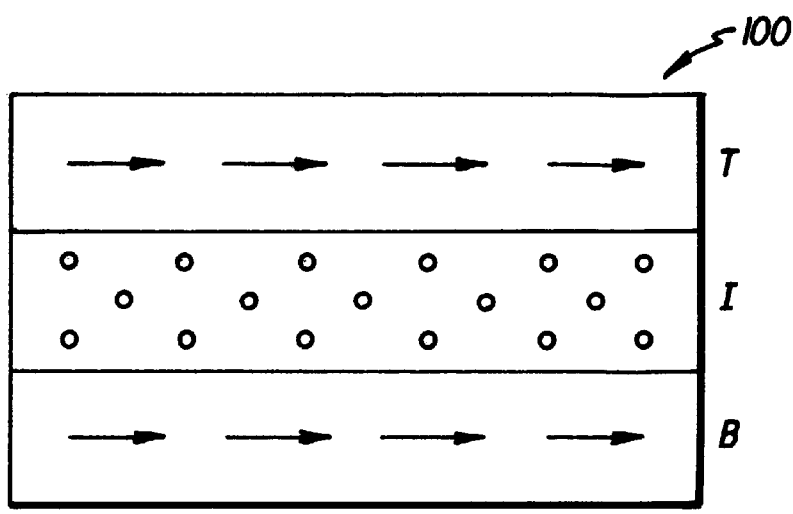
FIG. 2 is a cross-section of a preferred embodiment of the present invention.

FIG. 2 illustrates the parallel spin alignment that tends to maximize the spin splitting of the energy bands in the inner layer. This type of multi-layer structure produces a giant magneto-resistance (GMR) for an ordinary inner layer metal like copper, and such DC resistance devices are used for computer memory storage. FIG. 1 shows a plot of the optical reflectivity R of a material as a function of the frequency of the incoming light ($\omega$). The optical reflectivity curves (solid and dashed) show the unconventional decrease as a function of frequency for electron collisions on nearly parallel trajectories. By contrast, ordinary metals show a nearly 95% reflectance in the above frequency range, as shown by the data points (circles) for lead. An example of the anomalous decline is the data on a high temperature superconductor (squares and triangles).

In FIG. 2, base magnetic layer B has a fixed spin orientation, and a top magnetic layer T has a spin orientation that rotates with an applied magnetic field (although this orientation could be reversed). The inner layer I is preferably a metal whose optical reflectivity changes when the net spin of the two surrounding magnetic layers produces a spin splitting of the energy levels. Good candidates for the magnetic layers include, by way of non-limiting example, iron or permalloy. Typical inner layer materials include chromium and thin layers of materials whose electron paths are sensitive to the spin splitting.

By way of non-limiting example, chromium, which normally exhibits reflectivity of approximately 65% at an light energy of 1 eV, will reflect approximately 95% of light energy at 1 eV when used as the internal layer described herein, an increase in reflectively by a factor of approximately 1.46. However, other metals that normally exhibit reflectivity of approximately 50–80% at a light energy of 1 eV can reflect approximately 80–100% of light energy at 1 eV when used as the second layer described herein. Preferably, the reflectivity increases by a factor in the range of approximately 1.02 and approximately 2.00, and particularly in the range of approximately 1.45 to 1.60.

In the embodiment of FIG. 2, a thin layer of a material whose electron paths are sensitive to magnetic spin splitting due to external fields (e.g., chromium) is placed between two layers of a magnetic thin film material (e.g., iron). The thin films T and B, as well as that of the inner layer I can be made to be a variety of sizes and thickness. When a substrate with magnetic order is used, the magnetic spins of the B layer are fixed, and the orientation of the spins of the T layer can rotate in response to an external magnetic field. For substrates like silicon, the spins in the top and bottom layers are induced to point in opposite directions by exchange forces from electrons in the middle layer; then an external magnetic field will make the spins in both top and bottom layers point in the same direction.

Although the thickness of the three thin film layers can vary greatly, in one embodiment of the present invention the B and T layers preferably have a thickness of about 40 angstroms, and the I layer preferably has a thickness of about 100 angstroms. In such a configuration, the 40-angstrom B and T layers are thin enough to be transparent to electromagnetic radiation, such as laser light from a photodiode or laser diode. If the B and T layers are too thick, they become opaque to external light, and such light cannot reach, and therefore cannot be reflected by, the I layer. Though not necessary, the T and B layers are often of similar thickness (as in GMR layers).

The device of the present invention has a variety of uses and applications, including but not limited to, use as a magnetic sensor device and an optical modulator. An example of a use for this device as a sensor is a magnetic storage device, such as such as a compact disc with magnetic regions (CD). The CD stores information in the placement of small regions of magnetically aligned spins. Such regions of magnetically aligned spins create a small magnetic field in proximity to these regions (the localized small magnetic fields may be of complicated shape). As the device is scanned across the surface of the CD, the device encounters the localized regions of magnetic fields. In a given region containing a magnetic field, the field interacts with the T layer of the device, causing an alignment of magnetic spins (or more generally an alteration of the spins, which in turn alters the exchange field within the I layer region, and therefore within the sensor) in the I region. A small localized region of a magnetic field on a CD or a computer drive of about 10 Gauss can initiate a change in the magnetic field in the I region of 100,000 Gauss (four orders of magnitude). Such a large change in the magnetic field in the I region will substantially change the reflectivity of this layer that can be easily identified. This is why a material such as chromium, which has a reflectivity which dramatically changes due to spin splitting, typically brought on by an external magnetic field, is preferable for use for the I layer.

A light source, for instance the light from a laser diode, can be used to identify high and low reflectivity materials. Light from the laser diode can be directed toward the sensor. The light from the sensor can pass through the transparent thin film of the T (or B) layer. Such light then reflects off of the I layer, and the reflected light can be received by a known optical sensor. If the majority of the incident light is reflected back and received by the optical sensor, then the device appears "bright" and the I layer possesses a high reflectivity. If only a small amount of the incident light is reflected back into the optical sensor, the device appears "dark" and the I layer possesses a low reflectivity. By determining when the device appears bright and dark, and by knowing the position of the device at the times it appears bright and dark, one can map out in a simple fashion the regions on the CD that possess the small localized magnetic fields, and therefore interpret the information stored on such device.

If the inner metallic layer in the magneto-optic device is antiferromagnetic, there will be an energy gap in the electronic spectrum that also changes the optical reflectivity of such metals. When an applied magnetic field changes the energy gap, it produces a corresponding modification of the reflectivity at frequencies that are in the range of the energy gap. Previously it was thought that this effect could be particularly useful at infrared and microwave frequencies, but upon further investigation it has been determined that the possibility that a material with a large gap could be useful at visible light frequencies should be considered as well.

As will be apparent in light of the foregoing description, the present invention has the following advantages and benefits, among others:

1. A magnetic field detector that measures optical reflectivity directly are simpler and more cost effective than memory storage devices which use the Kerr effect to measure small variation in the polarization of reflected light.
2. A magnetic field detector that measures optical reflectivity directly are simpler and more cost effective than memory storage devices that measure small variation in the DC resistance.
3. A portable magneto-optic device using miniature lasers and tiny multi-layer films would be useful for detecting magnetic fields emanating from an object that contains iron, nickel, or other magnetic substance.
4. A portable magneto-optic device using miniature lasers and tiny multi-layer films would be useful for detecting magnetic fields emanating from an object that contains circuits that carry electrical current or transmit radiation.

Just as the incidence of light can be used to control and measure the magnetic field, so too can control of the magnetic field influence the reflectivity of incoming light. A coil electromagnet with adjustable current, or a movable permanent magnet, are non-limiting examples of adjustable sources of magnetic fields. A field strength of approximately 1 Gauss should be sufficient to change the reflectivity of the films described herein, although the field may be stronger or weaker. Under such control, the device could be used as an optical switch, and optical encoder, or part of a display. Depending on the desired effect, the field could be manipulated in an ON/OFF mode (e.g., OFF being considered either the absence of a magnetic field for an electromagnet, or too great of a distance for a permanent magnet), or a variable mode.

Figure 3:
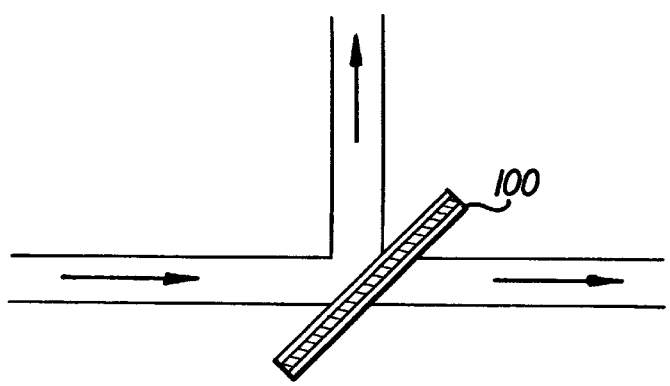
FIG. 3 is another embodiment of the present invention as a switch.

Referring now to FIG. 3, a magneto-optical device 100 has been incorporated into an optical network to serve as a switch. The device 100 can have multiple optical inputs (one is shown in FIG. 3) and multiple optical outputs (two are shown in FIG. 3). Preferably, the inputs and outputs are fiber-optic lines, although any light conduit (or lack thereof) may be used. The multi-layer film partially redirects and partially transmits a light data stream incoming from the left, although the relative reflectance and transmitance will change upon the application of a magnetic field. The amplitude of the reflected/transmitted light may also change based upon the applied magnetic field.

Figure 4:
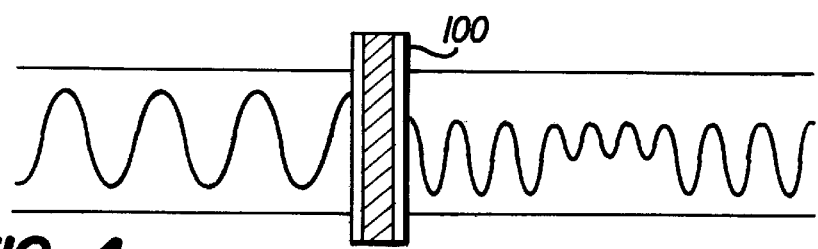
FIG. 4 is still another embodiment of the present invention as an encoder.

Device 100 can also be placed in the optical path to encode and/or change information in an optical data stream. Applying a magnetic field for a certain time interval when the data stream passes through the device will alter the amplitude and/or the phase of the data stream, thereby altering the content of the information therein. In FIG. 4, the incoming original data stream on the left is modified by device 100 to include a region of reduced amplitude corresponding to the newly encoded data.

Figure 5:
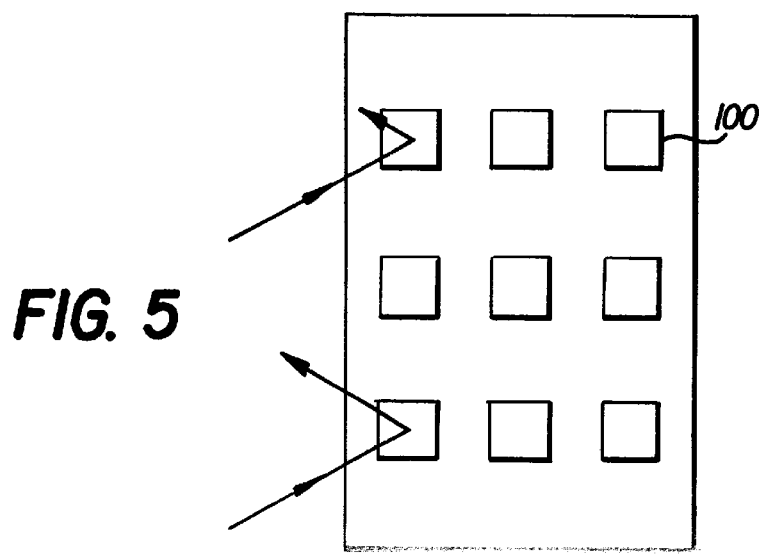
FIG. 5 is yet another embodiment of the present invention as a display.

Referring now to FIG. 5, several magneto-optical devices 100 (9 are shown in FIG. 5) can be used to create a display screen. As is known in the video arts, video images are the collective effect of thousands of pixels, each with its own color, that combine to create an image. In an embodiment of the present invention, each device 100 is a "dot" (or square) on the display screen. When exposing these dots to a light source (which may be artificial, segmented, uniform, and/or ambient), control of the individual magnetic field for each device 100 will affect the transmission, reflection, amplitude and/or phase or the incident light to create a color spot on the display screen. As with pixels, the collective effect of these "dots" produces an image on the display screen. Computer control over the magnetic fields of the individual devices 100 (or control over sub-groups of devices 100, each subgroup including one or more individual devices 100) allows for the display of a desired image.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

By way of non-limiting example the inner layer (which may be either a single layer or a combination of layers that collectively exhibit the noted characteristics) is between and adjacent the top and bottom layers. However, the invention is not so limited, and other intervening layers may be placed between the top and bottom layers.

Similarly, the top and bottom external layers are preferably the outermost layers of the device 100. However, it is also possible to cover either the top or bottom layers with one or more additional layers. Still further, either the top and bottom layers may be a single layer, or a combination of layers that collectively exhibit the noted characteristics.

What is claimed is:

1. A magneto-optic device, comprising:

a base magnetic layer;

a top magnetic layer having a spin orientation configured to be rotated by a magnetic field; and an inner layer which displays a change in optical reflectivity by a factor of at least approximately 1.02 when a magnetic field is applied, said inner layer being positioned between said base magnetic layer and said top magnetic layer.

2. The magneto-optic device of claim 1, wherein said inner layer comprises a material selected from the group consisting of chromium, rare earth metals, and high temperature superconductors.

3. The magneto-optic device of claim 1, wherein said top magnetic layer has a thickness of about 40 angstroms.

4. The magneto-optic device of claim 1, wherein said bottom magnetic layer has a thickness of about 40 angstroms.

5. The magneto-optic device of claim 1, wherein said inner layer has a thickness of about 100 angstroms.

6. A magneto-optic device, comprising:

first and second magnetic layers, one of said magnetic layers having a spin orientation configured to be rotated by a magnetic field; and an inner layer, positioned between said first and second layers, which experiences a change in optical reflectivity by a factor of 1.02 to 2.00 when a magnetic field is applied thereto.

7. The magneto-optic device of claim 6, wherein said inner layer comprises a material selected from the group consisting of chromium, rare earth metals, and high temperature superconductors.

8. The device of claim 6, wherein the inner layer is thicker than the first and second layers.

9. The device of claim 6, further comprising an adjustable source of a magnetic field in proximity to said inner layer.

10. The device of claim 6, further comprising at least one optical path incident upon said first layer, and at least one optical path incident of said second layer.

11. A magneto-optic device, comprising:

first and second magnetic layers; and an inner layer, positioned between said first and second layers, which experiences a change in optical reflectivity by a factor of at least approximately 1.02 when a magnetic field is applied thereto.

* * * * *